United States Patent [19]

Hermann et al.

[11] Patent Number: 5,444,425
[45] Date of Patent: Aug. 22, 1995

[54] FLUX-TRAPPED SUPERCONDUCTING MAGNETS AND METHOD OF MANUFACTURE

[75] Inventors: Allen M. Hermann, Jefferson County; Gol A. Naziripour, Boulder County, both of Colo.; Timir Datta, Richland County, S.C.

[73] Assignee: The Regents of the University of Colorado, Boulder, Colo.

[21] Appl. No.: 202,913

[22] Filed: Feb. 28, 1994

[51] Int. Cl.⁶ ............................................. H01F 7/22
[52] U.S. Cl. ..................... 335/216; 505/100; 505/124; 505/300; 505/400; 505/727; 505/779; 505/785
[58] Field of Search ................ 335/216; 505/100, 124, 505/300, 400, 727, 779, 785, 803

[56] References Cited

U.S. PATENT DOCUMENTS

| | | |
|---|---|---|
| 3,429,032 | 2/1969 | Martin et al. |
| 4,190,817 | 2/1980 | Rabinowitz ........................ 335/216 |
| 5,079,225 | 1/1992 | Holloway ........................... 505/729 |
| 5,168,096 | 12/1992 | Tournier ........................... 505/729 |

OTHER PUBLICATIONS

M. Rabinowitz, E. L. Garwin & D. J. Frankel, Lett. Al Nuovo Cimento 7, 1 (1973).
E. L. Garwin. M. Rabinowitz & D. J. Frankel, Appl. Phys. Lett. 22, 599 (1973).
M. Rabinowitz, H. W. Arrowsmith & S. D. Dahlgren, Appl. Phys. Lett. 30, 607 (1977).
M. Rabinowitz, IEEE vol. Mag. 11, 548–550 (1975).
K. Salama, V. Selvamanickam, L. GaO, K. Sun, Appl. Phys. Lett. 54, 2352 (1989).
R. Weinstein, I. G. Chen, J. Liu K. Lau, J. Appl. Phys. 70 (10), 15 Nov. 1991.
Z. Z. Sheng. Y. H. Liu, X. Fei, L. Sheng, C. Doug, W. G. Harter, A. M. Hermann, D. C. Vier, S. Schultz, S. B. Oseroff, Modern Physics Letters B.3,3 (1989) 249.
F. Pourarian, J. Phys. Chem. Solids 41, pp. 123–127, (1980).
E. W. Lee, F. Pourarian, Phys. Stat. Sol. (a) 33, 483 (1976).

*Primary Examiner*—Leo P. Picard
*Assistant Examiner*—Ramon M. Barrera
*Attorney, Agent, or Firm*—Flehr, Hohbach, Test, Albritton & Herbert

[57] ABSTRACT

A flux-trapped superconducting magnet which is formed of high transition temperature superconducting mixture doped with a magnetic material having a Curie temperature below the transition temperature of the superconducting mixture.

20 Claims, 5 Drawing Sheets

FLUX-TRAPPED SUPERCONDUCTING MAGNETS AND METHOD OF MANUFACTURE

BRIEF DESCRIPTION OF THE INVENTION

This invention relates generally to flux-trapped superconducting magnets and more particularly to flux-trapped magnets employing superconducting material doped with low Curie temperature magnetic material and to a method of manufacture.

BACKGROUND OF THE INVENTION

Flux-trapped permanent magnets composed of superconducting material have been characterized as very incomplete Meissner effect magnets. This type of magnet is formed by applying a large magnetic field (beyond $H_{c1}$) to a type II superconductor, and then turning off the external field. A portion of the field remains trapped inside the superconducting material. The trapped field is due to the persistent currents within the type II superconductor. These currents are microscopic vortex currents. The trapping mechanism occurs due to the pinning of the vortices. The pinning center is achieved by creating non-superconducting (normal) regions through impurities, inhomogeneities, or defects. A normal region may consist of tiny holes that are formed in the superconductor during its manufacture, or it may be subsequently etched to produce the holes. Photo-etching or plasma etching may be used to make a regular array of fine holes. Increased pinning forces at the edges of the normal regions tend to strongly trap the cores of the fluxolds in these regions. Trapped fields as high as 22400 Gauss at 4° K. have been achieved. Multipole external applied field resulted in a multipole trapped field.

After the discovery of high transition temperature, $T_c$, superconductors, practical trapped flux permanent magnets became more viable. This viability occurs since the high temperature-superconductor materials have extraordinarily high $H_{c2}$ values and require only modest cost for refrigeration at 77° K. This is a substantially lower cost than that of cooling to 4° K. In spite of this economical advantage, some disadvantages are associated with the application of high $T_c$ materials in fabricating flux-trapped magnets. The disadvantages include (1) low $H_{c1}$, (2) high flux creep, and (3) a large decreasing magnetization rate.

OBJECTS AND SUMMARY OF THE INVENTION

It is an object of this invention to provide an improved trapped flux superconducting magnet and method of manufacture.

It is another object of the invention to provide an improved trapped flux magnet using superconducting material doped with magnetic materials. The foregoing and other objects of the invention are achieved by a magnet formed with a high $T_c$ mixture of superconducting material doped with a magnetic material having a Curie temperature below the $T_c$ temperature and maintained at a temperature below the Curie temperature.

BRIEF DESCRIPTION OF THE DRAWINGS

The invention will be more clearly understood from the description to follow when read in connection with the accompanying drawings, wherein.

DESCRIPTION OF PREFERRED EMBODIMENTS

In accordance with this invention the trapped fields in magnets formed with high $T_c$ superconducting mixture or compound of elements are substantially increased by doping the superconducting compounds with a magnetic dopant having a Curie temperature lower than the zero resistive temperature $T_c$ of the superconducting mixture and cooling the doped superconducting compounds to temperatures below the Curie temperature while a large magnetic field is applied to the material. It is believed that the magnetic impurities play two important roles: a) they provide a normal region to trap the vortices, and b) according to the Faraday's law to increase the current in the vortices (this phenomena resembles the insertion of a ferromagnetic bar into a current carrying coil which increases the field). The detected magnetic field is the sum of the magnetic field trapped in the superconductor and the magnetic field directly contributed by the dopant.

Figure 1:
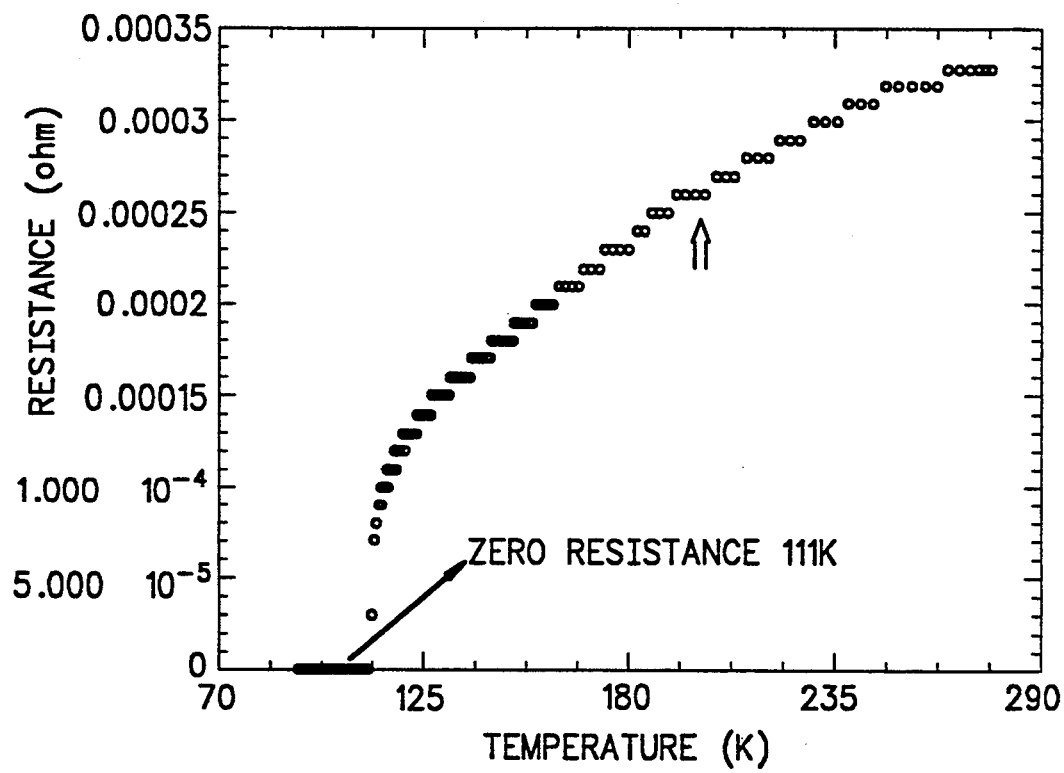
FIG. 1 shows resistance as a function of temperature for a copper-oxide based thallium superconductor.
Figure 2:
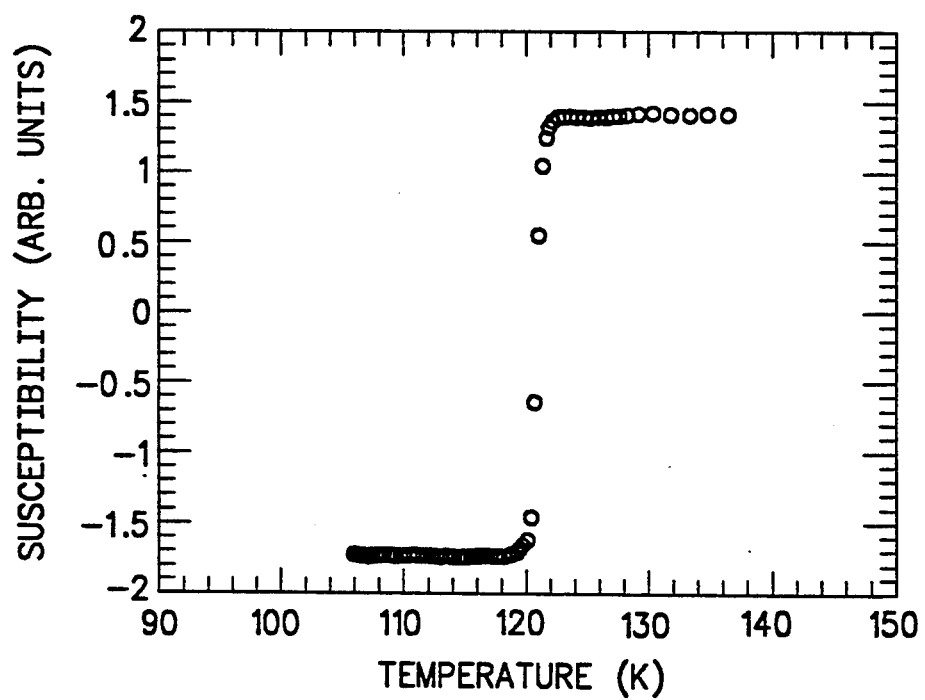
FIG. 2 shows the susceptibility as a function of temperature for the copper-oxide based thallium superconductor of FIG. 1.

In order to more clearly illustrate and understand the invention doped and undoped pellets of superconducting mixture of elements were manufactured and tested. In particular, nominal $Tl_2$, $Ba_2$, $Ca_2$, $Cu_3$ and $O_x$ (TBCCO) compounds were synthesized both with and without the addition of magnetic impurities. The nominal TBCCO compounds were synthesized by starting with a stoichiometric mixture of $Tl_2O_3$, BaO, CaO, CuO ground and pelletized at pressures of $2.2 \times 10^7$ atmospheres. The pellets were heated at 916° C. for five minutes in an encapsulated aluminum container. A transition temperature of 102° K. was obtained. To form a homogenous pellet with a higher transition temperature the pellets were sintered for 5 mins. at 916° C. in a encapsulated aluminum container. A transition temperature of 110° K. was achieved. Pellets with an even higher transition temperature were obtained by annealing at 750° C. in oxygen and thereafter slowly cooling the pellets. Transition temperatures as high as 120° K. were obtained. FIGS. 1 and 2 show the resistance and susceptibility of a sintered pellets as a function of temperature.

As described above this invention is directed to trapped field superconducting magnets formed by mixing or doping a stoichiometric mixture of superconducting material with a magnetic material having a Curie temperature lower than the zero resistive temperature of the superconducting material and cooling the doped mixture to temperatures below the transition temperatures while a large magnetic field is applied to the material.

A representative list of magnetic elements, alloys and oxides that have low Curie temperatures is shown in Table 1. The saturation magnetization and Curie temperatures are listed.

TABLE 1

| Material | Curie Temperature (K.) | Saturation Magnetization Units |
|---|---|---|
| Dy | 85 | — |
| TbAl$_2$ | 110 | 9.6 |
| Nd(Co)$_2$ | 105 | 3.6 |
| EuO | 77 | 6.9 |

TbAl$_2$ and Nd(Co)$_2$ were synthesized by mixing stoichiometric amounts of TbAl$_2$ and Nd(Co)2 alloys melted in an argon arc furnace in a RF water cooled copper hearth.

To obtain homogeneity, each sample was remelted twice. The purity of the starting materials was 99.9% for the rare earth alloy and 99.99% for aluminum alloy. In the case of TbAl$_2$, the samples were strain annealed for a period of one week at 1000° C. in an evacuated ($10^{-5}$ torr pressure) in a sealed silica tube. In the case of Nd(CO)2 alloy, the sample was annealed at 500° C. for 5 days. Both alloys were then ball milled for 2.5 hours. The particle size varied between 0.7 to 5 $\mu$m. The powders were stored under argon until they were mixed with the superconducting compound.

Figure 3:
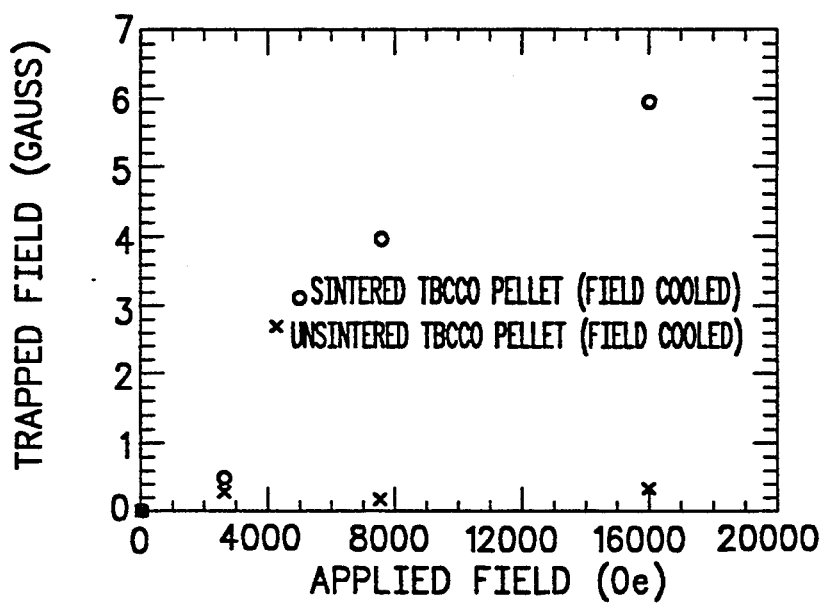
FIG. 3 shows the trapped field as a function of field applied to a copper-oxide based thallium superconductor sintered pellet cooled with applied field and a pressed unsintered pellet cooled with applied field.

FIG. 3 shows the trapped field, using a Gaussmeter, for a TBCCO undoped control pressed powder pellet and an undoped control TBCCO pellet sintered at 916° C. This shows more than a ten-fold increase in the sintered pellet as compared to the unsintered pellet.

Figure 4:
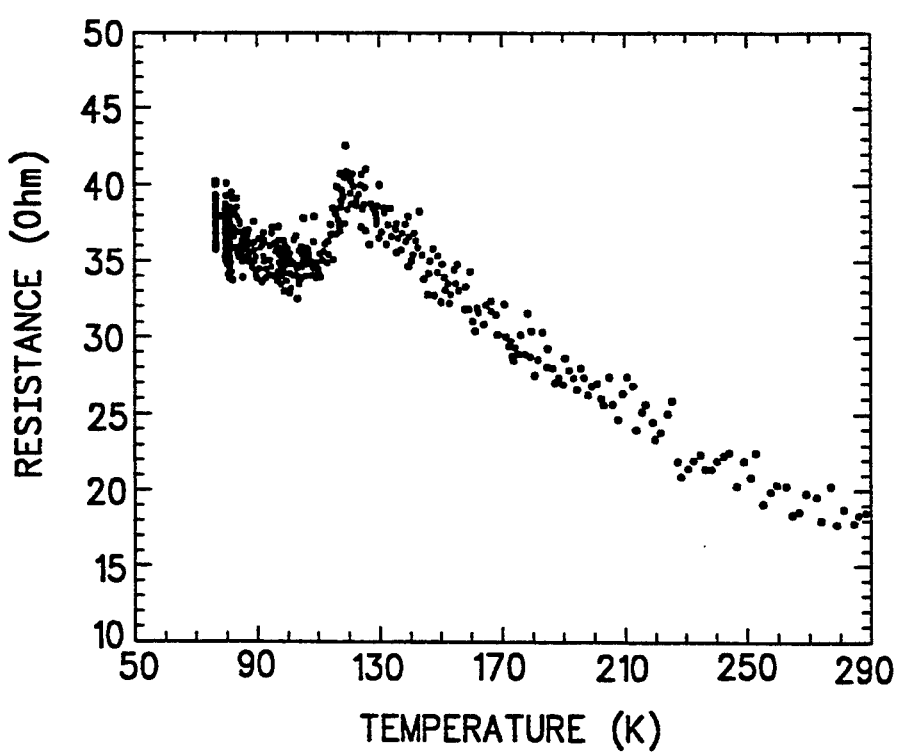
FIG. 4 shows resistance as a function of temperature for a copper-oxide based superconductor doped with low Curie temperature magnetic material.
Figure 5:
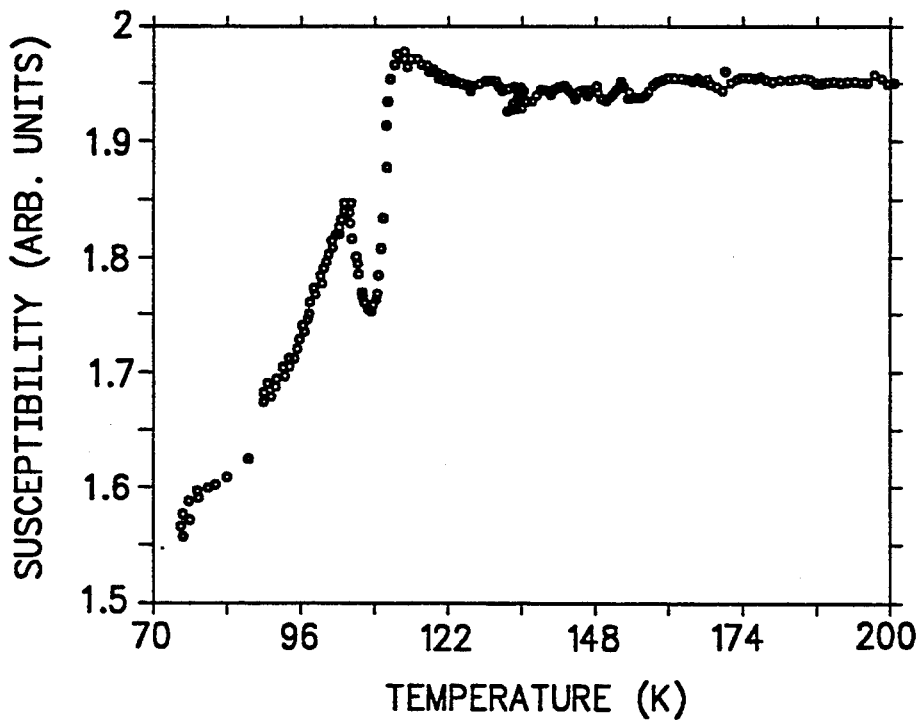
FIG. 5 shows the susceptibility as a function of temperature for the copper-oxide based barium superconductor doped with low Curie temperature magnetic material.

FIGS. 4 and 5 show the electrical resistance and ac susceptibility after adding 13% by weight of TbAl$_2$ to a TBCCO superconducting mixture. It is obvious from FIGS. 4 and 5 that the superconducting and magnetic behaviors are independently observable in the compound. However, the transition temperature of the superconducting material is shifted to a lower value than its original value after mixing with the magnetic impurity. The resistance versus temperature (FIG. 4) of the mixture showed an initial increase in the resistance prior to the transition temperature (a semiconductor-like behavior). The non-zero value of the resistance (FIG. 4) at the transition temperature is common in pressed superconducting powder that has not been sintered. Also, the normal state resistance increased due to the 13% concentration of non-superconducting dopants.

Figure 6:
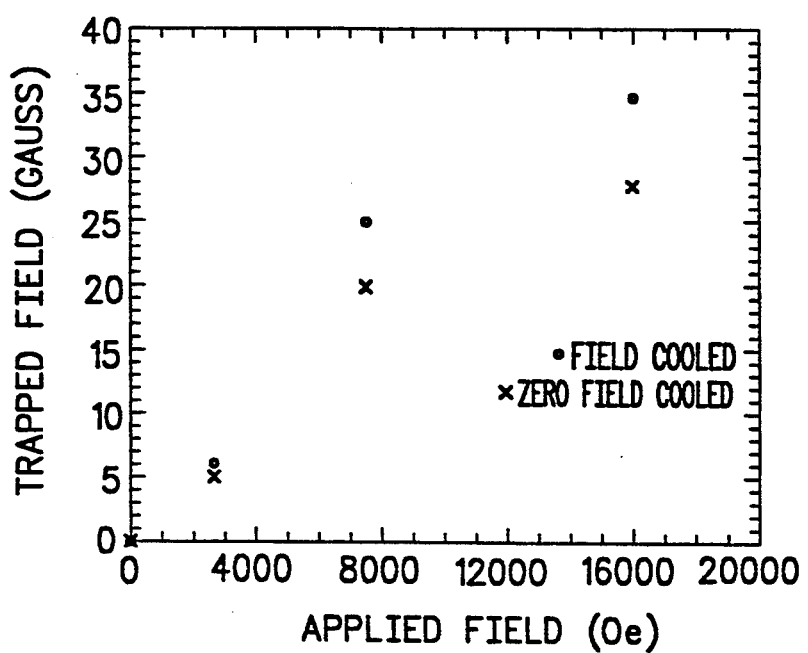
FIG. 6 shows trapped field as a function of applied field for a copper-oxide based thallium superconducting mixture doped with 13% dysprosium detected at 4 mm from the sample cooled below its $T_c$ temperature both with and without magnetic field applied.
Figure 7:
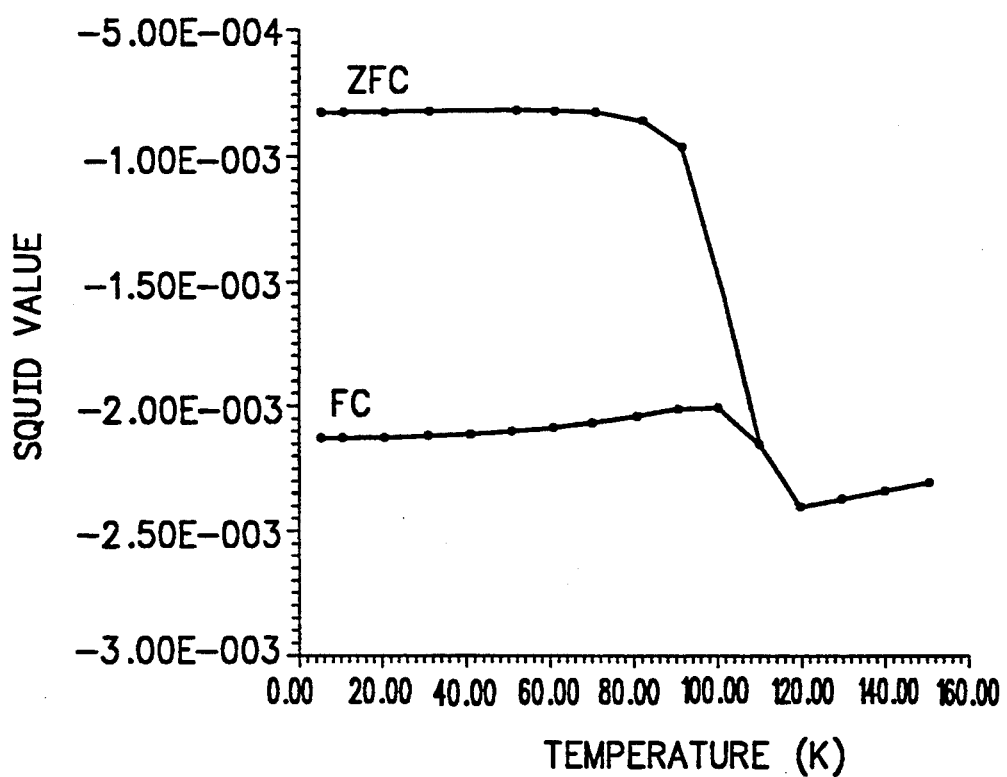
FIG. 7 shows the SQUID value of trapped magnetic field for a sintered pellet of the copper-oxide based thallium superconductor cooled with zero field and cooled with a 2Tesla (T) magnetic field.
Figure 8:
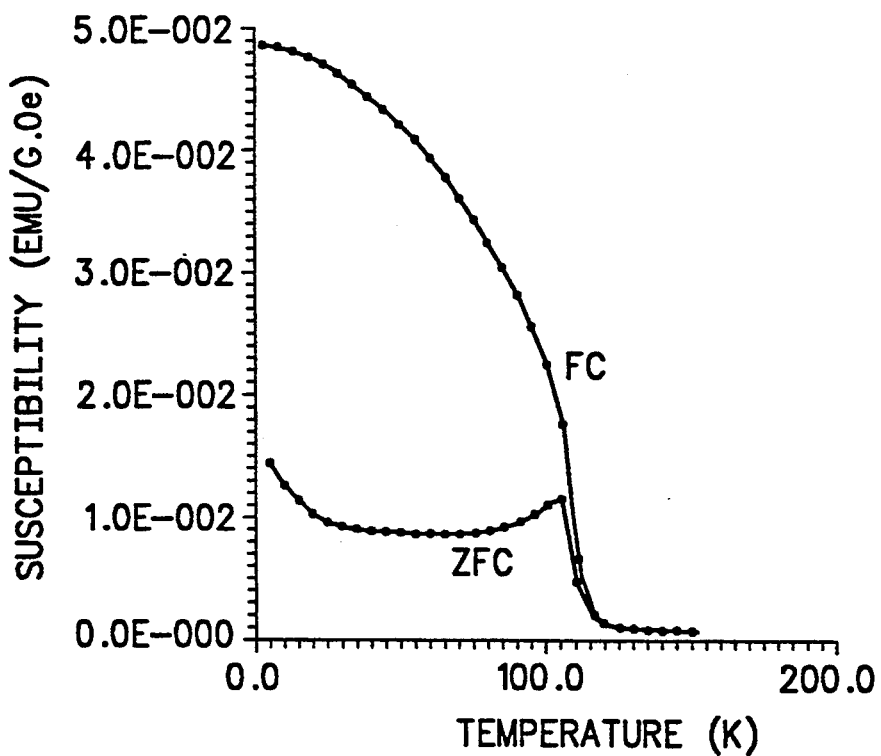
FIG. 8 shows the susceptibility as a function of temperature for a sample including 13% $TbAl_2$ dopant cooled with zero field and cooled in a magnetic field of 2Tesla.
Figure 9:
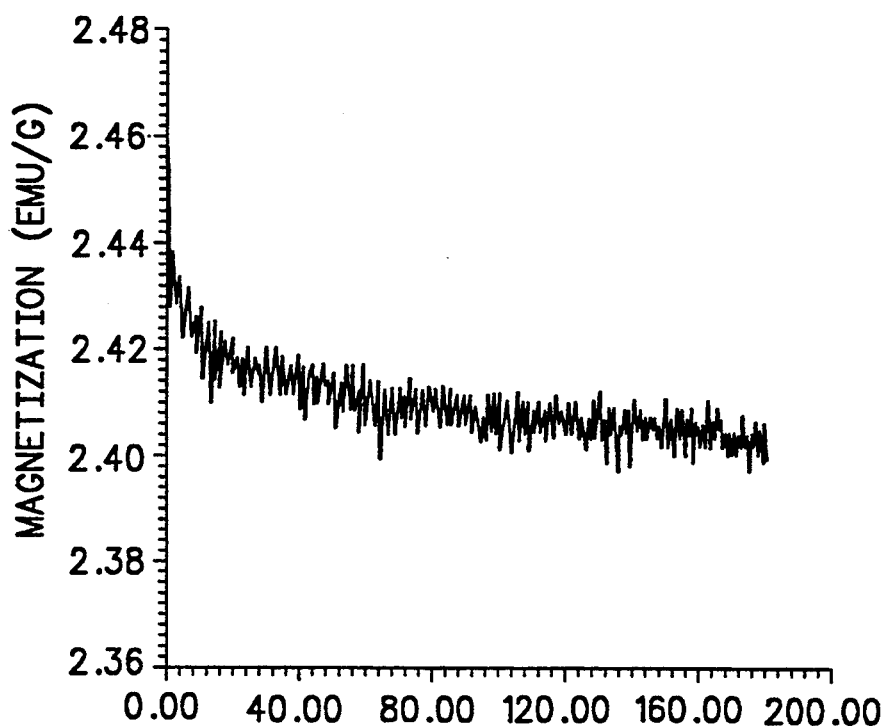
FIG. 9 shows the time decay of magnetization for a sintered pellet of copper-oxide based thallium superconductor.
Figure 10:
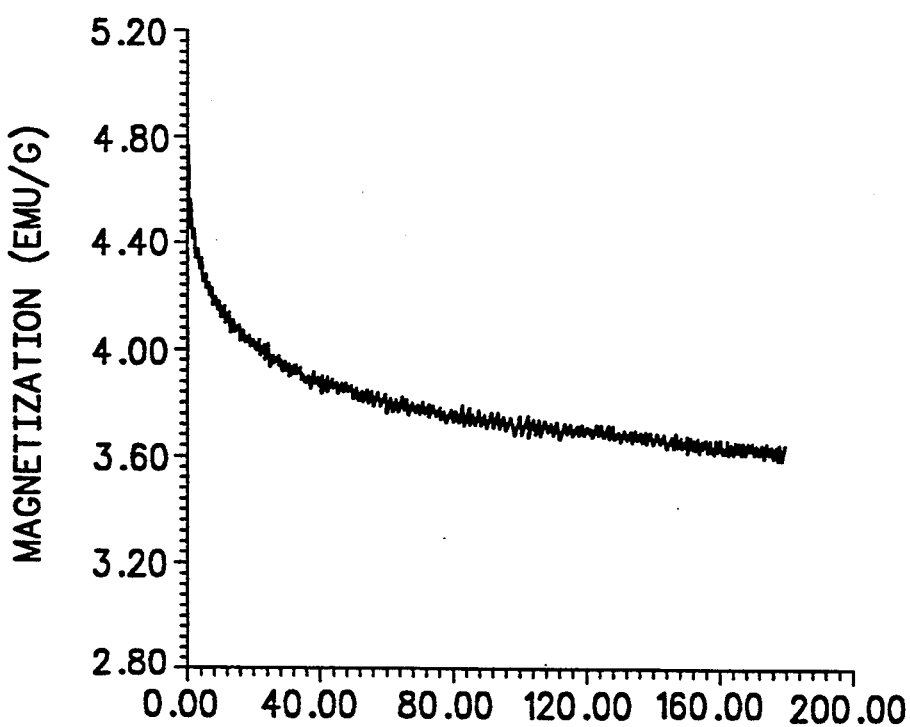
FIG. 10 shows the time decay of magnetization of a pellet with copper-oxide based thallium superconductor material doped with Dysprosium powder.

The samples that were field cooled showed a larger trapped field than those of the zero field cooled. This is demonstrated in FIG. 6. In the case of zero field cooled data, the magnetization arises mainly due to the magnetic impurity and not the trapped flux. But in the case of the field cooled data, the magnetization is increased by flux pinning and flux is trapped as a result of magnetic and non-magnetic impurity. The difference between trapped field for a field cooled sample and a zero field cooled sample is the trapped magnetic field. For a given size pellet made of 80% TbAl$_2$ and 20% TBCCO, a magnetic field of 194 Gauss. was detected in the axial direction. For a larger pellet made of 80% Dysprosium (2.5 gr, with a dimension of one centimeter diameter and 3 mm thickness) and 20% TBCCO in an applied magnetic field of 2Tesla, a trapped field of 800 Gauss was detected in the axial direction. A magnetic field of 1500 Gauss was detected when two identical pellets were stacked and zero field cooled in a magnetic field of 2 Tesla. FIGS. 7 and 8 show magnetic susceptibility at different temperatures (field cooled and zero field cooled) for sintered pellets of TBCCO and TBCCO+% 13 TbAl$_2$ respectively. At the lower temperature, the difference between the field cooled and zero field cooled is larger and hence a larger field is trapped. FIG. 9 shows the decline of magnetization for a sintered pellet of TBCCO. FIG. 10 shows the time decay of the magnetization of a pellet when the sample is doped with Dysprosium powder.

The origin of the trapped field was further examined by preparing two different pellets with the same weight (2.2 grams) in the following manner. The first pellet was prepared from superconducting powder TBCCO-2223 to which 18% (by weight) Dysproslum was added. The pellet was prepared at $2.2 \times 10^7$ Pa at room temperature. A magnetic field of 8 Gauss was applied. Upon removal of the sample from the liquid nitrogen, the Gaussmeter (Hall probe) showed a trapped magnetic field of around 22 Gauss.

The second identical pellet was prepared by mixing 18% (by weight) of Dysprosium with non-superconducting Ba$_2$Ca$_2$Cu$_3$O$_x$. A magnetic field of 8 Gauss was applied to the pellet in ZFC and the Hall probe showed a trapped field of 12 Gauss. This is then the field due to the magnetic dopant alone. The difference between the detected field from superconducting and non-superconducting pellet is hence around 11 Gauss. One may also argue the trapped field arises as a result of trapped field from the superconducting material, but, as we have already demonstrated in FIGS. 3 and 6, the trapped field in a pressed(but undoped) superconducting powder is small in comparison.

The SQUID data can be expressed in Tesla (T) by converting the electromagnetic unit (emu) to the detected magnetic field in Tesla. We consider the initial magnetization at zero time in FIGS. 9 and 10 with the corresponding values of 4.8 (doped) and 2.44 (undoped) emu/gr respectively. For conversion to the magnetic field, these values are multiplied by the average density (7780 Kg/m$^3$) of TBCCO and Dysprosium (8550 Kg/m$^3$) to give a magnetization values of 516000 emu/m$^3$ and 215000 emu/m$^3$ respectively. For conversion into the SI unit, the equation $B=\mu_0(H+M)$ is used with $H=0$, and $\mu_0=4\pi \times 10^{-7}$. The equivalent trapped magnetic fields are $515\times 10^{-4}$T and $215\times 10^{-4}$T respectively.

Calculation of the trapped field from SQUID is made more reliable by using the magnetization versus temperature data from FIGS. 7 and 8. For the TbAl$_2$ doped field cooled sample $$B_F = \mu_0(H + M_F).$$

For the zero field cooled sample $$B_Z = \mu_0(H + M_Z).$$

The difference between field cooled and zero field cooled provides the trapped field in the pellet $$B_{trap} = B_F - B_Z = \mu_0(M_F - M_Z).$$

Any remanent magnetization from the SQUID device itself is therefore eliminated by this approach. Substituting for the values of $M_F$ and $M_Z$ from FIGS. 7 and 8 at 77K into the equation 3.3 gives $B_{trap} = 27 \times 10^{-4}$T, but this is the trapped field in an applied field of only 10 Gauss. Since at low applied fields, the Hall probe data suggest linearity between the trapped field and the applied field, we extrapolate the SQUID data to an applied magnetic field of 300 Gauss linearly to give an estimate of the trapped field (at 300 G applied magnetic field) of $30 \times 27 = 810$ Gauss for a 0.2 gm sample (the Hall data were taken on a 2 gm sample).

In another example, several tiles (samples) of YBa$_2$Cu$_3$O$_7$ (Y123) were produced. Three tiles were doped with 0.2% by weight of TbAl$_2$. The average trapped field for undoped tile was found to be about $B_{trap} = 1280$ Gauss. A very good undoped sample with $B_t = 1500$ Gauss was produced in about one in ten tiles. Three tiles doped with 0.2% by weight TbAl$_2$ were tested. The resulting trapped fields were: $B_t = 2169$ Gauss; $B_t = 1579$ Gauss; and $B_t = 1404$ Gauss. The average trapped field was therefore 1717 Gauss. This is a 34% increase over the trapped field $B_T - 1280$ of the undoped tile.

The above data suggest that it is possible to enhance the total magnetic field trapped in TBCCO materials by mixing them with magnetic powder. Further enhancement is also possible by a doping and sintering of the TBCCO pellet. The difference between the ZFC and the $T_c$ data on the sintered TBCCO superconducting powder and magnetically doped TBCCO superconducting pressed powder demonstrated signs of trapped field. It is now clear that two separate factors are contributing in the trapping of the magnetic field: texturing and doping the magnetic materials. Further increases in trapped flux can be obtained by texturing.

A detailed description of a trapped flux superconducting magnet formed by processing a high transition temperature superconducting mixture of the elements Tl, Ba, Ca, Cu and O mixed with a magnetic material having a lower Curie temperature than the transition temperature has been described. It is apparent that other high transition temperature mixture of elements having high superconducting transition temperatures can be mixed with low Curie temperature magnetic material to form trapped flux barium superconducting magnets. For example, high transition temperature gadolinium, copper oxide, yttrium-barium-copper-oxide, bismuth-strontium-calcium-copper-oxide and mercury-barium-calcium-copper-oxide superconducting mixtures can be processed with lower Curie temperature magnetic materials to carry out this invention.

What is claimed:

1. A superconducting magnet comprising a mixture of:
   elements forming a high transition temperature superconductor compound, and
   a magnetic material having a Curie temperature below the transition temperature cooled below the Curie temperature while a magnetic field is applied to the body.

2. A superconducting magnet as in claim 1 wherein the elements forming the superconducting compound are thaliium, barium, calcium, copper and oxygen.

3. A superconducting magnet as in claim 1 in which the elements are yttrium, barium, copper and oxygen.

4. A superconducting magnet as in claim 1 in which the elements are gadolinium, barium, copper and oxygen.

5. A superconducting magnet as in claim 1 in which the elements are bismuth, strontium, copper and oxygen.

6. A superconducting magnet as in claim 1 in which the elements are mercury, barium, calcium, copper and oxygen.

7. A superconducting magnet as in claims 1, 2, 3, 4, 5 or 6 wherein the magnetic material is dysprosium.

8. A superconducting magnet as in claims 1, 2,. 3, 4, 5 or 6 wherein the magnetic material is TbAl$_2$.

9. A superconducting magnet as in claims 1, 2, 3, 4, 5 or 6 wherein the magnetic material is Nd(Co)$_2$.

10. A superconducting magnet as in claims 1, 2, 3, 4, 5 or 6 wherein the magnetic material is EuO.

11. The method of manufacturing a flux-trapped superconducting magnet comprising:
    providing a mixture of:
      elements which form a high-transition temperature superconducting compound, and
      a magnetic material having a Curie temperature below the transition temperature of the superconducting compound;
    processing the mixture to form a body of material;
    applying a magnetic field to the body of material; and
    cooling the body to a temperature below the Curie temperature of the magnetic material whereby magnetic flux is trapped in said body.

12. The method as in claim 11 wherein the elements which form the superconducting compound are thallium, barium, calcium, copper and oxygen.

13. The method as in claim 11 wherein the elements which form the superconducting compound are yttrium, barium, copper and oxygen.

14. The method as in claim 11 wherein the elements which form the superconducting compound are gadolinium, barium, copper and oxygen.

15. The method as in claim 11 wherein the elements which form the superconducting compound are bismuth, strontium, copper and oxygen.

16. The method as in claim 11 wherein the elements which form the superconducting compound are mercury, barium, calcium, copper and oxygen.

17. The method as in claims 12, 13, 14, 15 or 16 wherein the magnetic material is dysprosium.

18. The method as in claims 12, 13, 14, 15 or 16 wherein the magnetic material is TbAl$_2$.

19. The method as in claims 12, 13, 14, 15 or 16 wherein the magnetic material is Nd(CO)$_2$.

20. The method as in claims 12, 13, 14, 15 or 16 wherein the magnetic material is EuO.

* * * * *